(12) United States Patent
Okada et al.

(10) Patent No.: US 8,227,810 B2
(45) Date of Patent: Jul. 24, 2012

(54) SEMICONDUCTOR DEVICE AND METHOD FOR MANUFACTURING SAME

(75) Inventors: Masaya Okada, Osaka (JP); Makoto Kiyama, Osaka (JP); Seiji Yaegashi, Yokohama (JP); Ken Nakata, Yokohama (JP)

(73) Assignees: Sumitomo Electric Industries, Ltd., Osaka-shi (JP); Sumitomo Electric Devices Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/126,569

(22) PCT Filed: Jul. 9, 2010

(86) PCT No.: PCT/JP2010/061679
§ 371 (c)(1),
(2), (4) Date: Apr. 28, 2011

(87) PCT Pub. No.: WO2011/013500
PCT Pub. Date: Feb. 3, 2011

(65) Prior Publication Data
US 2011/0204381 A1    Aug. 25, 2011

(30) Foreign Application Priority Data
Jul. 30, 2009   (JP) .................. 2009-178324

(51) Int. Cl.
*H01L 29/15*    (2006.01)
(52) U.S. Cl. .......... 257/76; 257/E29.089; 257/E21.403; 438/172
(58) Field of Classification Search .......... 257/76, 257/E29.089, E21.403; 438/172
See application file for complete search history.

(56) References Cited

U.S. PATENT DOCUMENTS

| | | | |
|---|---|---|---|
| 6,855,981 B2 * | 2/2005 | Kumar et al. | 257/328 |
| 2003/0042538 A1 | 3/2003 | Kumar et al. | |
| 2006/0060895 A1 | 3/2006 | Hikita et al. | |
| 2007/0108606 A1 | 5/2007 | Watanabe | |
| 2007/0131968 A1 | 6/2007 | Morita et al. | |
| 2007/0164315 A1 | 7/2007 | Smith et al. | |
| 2008/0079009 A1 * | 4/2008 | Yaegashi | 257/77 |
| 2009/0042345 A1 | 2/2009 | Saxler et al. | |

FOREIGN PATENT DOCUMENTS

| | | |
|---|---|---|
| JP | 2003-068760 A | 3/2003 |
| JP | 2003-068981 A | 3/2003 |
| JP | 2006-086398 A | 3/2006 |
| JP | 2007-149794 A | 6/2007 |
| JP | 2008-091595 A | 4/2008 |
| JP | 2008-219021 A | 9/2008 |
| JP | 2008-227501 A | 9/2008 |

* cited by examiner

*Primary Examiner* — Tony Tran
(74) *Attorney, Agent, or Firm* — Venable LLP; Michael A. Sartori; Christopher Ma

(57) ABSTRACT

There are provided a semiconductor device that includes a bypass protection unit against surge voltage or the like, achieves good withstand voltage characteristics and low on-resistance (low On-state voltage), has a simple structure, and is used for large-current purpose and a method for producing the semiconductor device.
In the present invention, the semiconductor device includes an $n^+$-type GaN substrate 1 having a GaN layer that is in ohmic contact with a supporting substrate, a FET having an $n^-$-type GaN drift layer 2 in a first region R1, and an SBD having an anode electrode in a second region R2, the anode electrode being in Schottky contact with the $n^-$-type GaN drift layer 2. The FET and the SBD are arranged in parallel. A drain electrode D of the FET and a cathode electrode C of the SBD are formed on the back of the $n^+$-type GaN substrate 1.

2 Claims, 12 Drawing Sheets

(a)

(b)

(c)

FET

SBD (a)

(b)

SEMICONDUCTOR DEVICE AND METHOD FOR MANUFACTURING SAME

TECHNICAL FIELD

The present invention relates to a small semiconductor device that is used for high-power switching and can achieve good withstand voltage characteristics and low On-state voltage, and a method for producing the semiconductor device.

BACKGROUND ART

High reverse breakdown voltage and low on-resistance are required for large current switching elements. To achieve the protection against surge voltage or the like, there has been proposed a structure in which a Schottky barrier diode (SBD) is additionally arranged in parallel between a source and a drain of a power field effect transistor (FET) that functions as a switching element (PTL 1). In a GaN-based semiconductor layer formed on a sapphire substrate, the SBD accompanying the power FET (no specific structure is disclosed in PTL 1) includes an anode electrode that is in Schottky contact with an AlGaN layer and a cathode electrode that is in ohmic contact with a GaN layer, and a two-dimensional electron gas is generated at an interface between the GaN layer and the AlGaN layer.

Citation List

Patent Literature

PTL 1: Japanese Unexamined Patent Application Publication No. 2008-219021

SUMMARY OF INVENTION

Technical Problem

In the above-described device, the on-resistance and withstand voltage characteristics may be improved, but the entire structure of the device becomes complicated. In a large current switching element, there is a tendency to use a vertical element in which a current flows in the thickness direction of a semiconductor layered body. However, in the case of a vertical element, the current-carrying capacity is determined by the circumference of an SBD, which is a protective element. Therefore, it is difficult to increase the current-carrying capacity and a sufficient amount of current cannot be discharged when a surge voltage or the like with a large current is applied.

An object of the present invention is to provide a semiconductor device that includes a bypass protection unit against surge voltage or the like, achieves good withstand voltage characteristics and low on-resistance (low On-state voltage), has a simple structure, and is used for large-current purpose and a method for producing the semiconductor device.

Solution to Problem

The semiconductor device of the present invention includes a first conductivity type substrate, a FET having a first conductivity type drift layer and constituting a switching element in a first region of the substrate, and an SBD having an electrode that is in Schottky contact with a first conductivity type layer located in a second region of the substrate. The FET and the SBD are arranged in parallel, the substrate is a GaN substrate, and a backside electrode of the FET and a backside electrode (the counterpart of a Schottky electrode) of the SBD are formed on the back of the GaN substrate. Herein, the semiconductor device of the present invention is intended to be any of electrical devices such as electronic apparatuses for light electrical appliances, electrical devices for heavy electrical equipment, electrical devices for car electronics, and electrical devices for electric trains or the like.

In the above-described structure, a vertical FET that is a switching element and a vertical SBD are arranged in parallel on the same GaN substrate, and the SBD functions as a protective element of the FET against surge voltage or the like. The GaN substrate has conductivity, and a backside electrode such as a drain electrode of the FET or a cathode electrode of the SBD can be directly formed on the back of the GaN substrate through ohmic contact. The backside electrode may be an integrated body formed at the same timing and may be a common electrode of the drain electrode and the cathode electrode. In this case, a simple structure having a small size is achieved. The channel of the FET may have a metal oxide semiconductor (MOS) structure or a high electron mobility transistor (HEMT) structure that generates a two-dimensional electron gas or the like.

Furthermore, since a GaN-based drift layer or the like is directly formed on the GaN substrate, there is no need to use a buffer layer or the like. By simplifying the structure of the epitaxial layered body without using a buffer layer, the production process is simplified and thus the production time can be shortened and the production yield can be improved. By combining the above-described advantage with the advantages of the mounting of the FET and the SBD onto the same GaN substrate and the formation of a backside electrode in a shared manner, the entire structure can be simplified and a reduction in size can be achieved.

Since a GaN-based semiconductor layer formed on a GaN substrate is a vertical element and has good withstand voltage characteristics and low on-resistance, a large current can be passed. In the case where the channel has a HEMT structure, among wide gap semiconductors, a hetero device is easily formed using GaN (GaN includes many crystals that are epitaxially grown and have different band gaps) compared with SiC or the like. Therefore, a channel such as a two-dimensional electron gas layer can be easily formed. Thus, significantly low on-resistance can be achieved.

The first conductivity type layer of the SBD that can be called a drift layer is herein simply referred to as a first conductivity type layer without adding "drift" to distinguish the first conductivity type layer of the SBD from a first conductivity type drift layer of the FET. In the description of a production method or the like, there may be the case where a common first conductivity type drift layer is formed in the FET and the SBD in a certain production method. In such a case, "drift" is added to both the first conductivity type layers.

The first conductivity type layer of the SBD and the first conductivity type drift layer of the FET may be formed at the same film formation timing or may be formed separately. As described below, even in the case where they are formed at the same film formation timing, an object that prevents or obstructs passing of current may be disposed between the FET and the SBD.

The semiconductor device may include a second conductivity type layer and a first conductivity type cap layer formed on the first conductivity type drift layer in the first region and each having an opening formed therein, wherein a cylindrical channel-forming portion of the FET is located so as to contact an inside surface of the opening, a gate electrode is located so that the gate electrode and an inside surface of the second conductivity type layer in the opening sandwich the channel-forming portion, and the second conductivity type layer extends from the first region to the second region and contacts a Schottky electrode of the SBD. With this extending second conductivity type layer, a guard ring for the Schottky electrode of the SBD can be formed, which can improve the withstand voltage characteristics of the SBD. The second conductivity type layer is not necessarily in ohmic contact with the Schottky electrode of the SBD, but ohmic contact further improves the withstand voltage characteristics. The channel-forming portion is a regrown layer in the case of a HEMT structure, there are the case (HEMT structure) where the channel-forming portion itself includes a channel and the case (MOS structure) where the channel-forming portion itself does not include a channel and is an insulating film for forming a channel of an inversion layer in the second conductivity type layer.

The channel portion may be a regrown layer that includes a first GaN-based semiconductor layer through which carriers transit and a second GaN-based semiconductor layer having a band gap larger than that of the first GaN-based semiconductor layer. Thus, the channel portion can be constituted by a two-dimensional electron gas with high mobility and the on-resistance can be decreased.

The drift layer of the FET is formed by causing the first conductivity type layer in the second region to extend to the first region, and (d1) a continuous body can be formed without disposing an obstacle to current between the first region and the second region of the first conductivity type layer, (d2) an i-type GaN-based layer can be interposed therebetween, (d3) an insulating layer can be interposed therebetween, or (d4) a groove can be formed therebetween. Thus, the FET and the SBD can be electrically separated from each other at any level in order to satisfy various required levels of reliability, resistance to surge, and the like.

A FET region including two or more FETs grouped together and an SBD region including two or more SBDs grouped together are arranged on a GaN substrate, the FET region and the SBD region having a boundary therebetween. The FETs can be connected to a corresponding SBD or corresponding SBDs in parallel in an individual or grouped manner. Herein, the SBD connected in parallel with the FETs that belong to the same group belongs to the same group. Consequently, a simple wiring configuration can be achieved while dealing with a large current. For example, in a device including a plurality of FETs in order to treat a large current, by arranging the group including a plurality of FETs and one or a plurality of SBDs in a direction perpendicular to the direction of the boundary (the upper electrodes (anode electrode and source electrode) of the SBD and the FET disposed with the boundary therebetween are electrically connected to each other), the current path for the large current can be easily made by film formation and thus the production process can be simplified.

Two or more FET regions including two or more FETs grouped together and one or more SBD regions including two or more SBDs grouped together are arranged on a GaN substrate so that one out of the two or more FET regions and the one or more SBD regions is interposed between the others. The FETs can be connected to a corresponding SBD or corresponding SBDs in parallel in an individual or grouped manner. Since the grouping of the FETs and SBDs is easily performed, a plurality of the same groups to be connected to each other in parallel can be easily selected. Furthermore, in the same group, the sorting into the in-phase subgroup in which On/Off operation is conducted in phase can be easily performed. Therefore, the sorting of a current path and a signal line for a large current that requires On/Off operation performed on a plurality of FETs in phase can be achieved with a simple structure. Since the FET regions and the SBD region are located so as to be adjacent to each other, heat generated at the FET regions and the SBD region is easily conducted to the adjacent region. Therefore, despite the fact that a large current can be passed with a simple structure, the temperature is not locally increased, whereby the thermal resistance can be improved.

Two or more FETs and one or more SBDs are arranged on a GaN substrate. The SBDs are each located in at least one of positions adjacent to a FET. The FETs can be connected to a corresponding SBD or corresponding SBDs in parallel in an individual or grouped manner. Thus, heat generated by a large current that flows through the FETs can be dissipated. There is also an advantage in that heat generated in the SBDs by surge voltage or the like is dissipated.

The semiconductor device may include an interlayer insulating film that covers gate electrodes in the plurality of FETs, wherein upper electrodes, of the FETs, that are not covered with the interlayer insulating film and a Schottky electrode of the SBD corresponding to the FETs are electrically connected to each other in an individual or grouped manner through a common wiring layer. Thus, the current path for a large current is simplified while being insulated from the signal line connected to the gate electrodes with certainty, and can be easily formed in a simple production process.

The semiconductor device may include a second conductivity type layer and a first conductivity type cap layer each having an opening that extends in a ridge shape and formed on the first conductivity type drift layer in the FET, wherein a channel-forming portion of the FET extends while contacting an inside surface of the opening that extends in a ridge shape, a gate electrode extends so that the gate electrode and an inside surface of the second conductivity type layer in the ridge-shaped opening sandwich the channel-forming portion, two source electrodes extend so as to sandwich the extending gate electrode when viewed in plan, a Schottky electrode of the SBD extends in a direction in which the two source electrodes extend, and the second conductivity type layer contacts the Schottky electrode of the SBD. Thus, the upper electrodes (source electrodes) and the gate electrodes of the FET can be formed, for example, in a comb shape. The Schottky electrode is arranged so as to be electrically connected to the upper electrodes of the FET. For example, in the case where the FET and the SBD are formed between two base electrodes facing each other when viewed in plan, there can be employed a structure in which two upper electrodes (source electrodes) of the FET and a Schottky electrode of the SDB disposed beside the FET are caused to extend from one of the base electrodes and one or two gate electrodes of the FET are caused to extend from the other of the base electrodes so as to be inserted between the upper electrodes. By densely arranging the gate electrodes and the upper electrodes of the FET, a large current can be passed in the thickness direction while large current density is maintained. Furthermore, since the second conductivity type layer of the FET extends so as to be in contact with the Schottky electrode of the SBD, the second conductivity type layer can produce an effect similar to a guard ring effect.

A semiconductor device is an inverter including a first chip and a second chip different from the first chip and configured to convert direct-current power and three-phase current power into each other, wherein the first chip and the second chip each include at least one FET and at least one SBD corresponding to a first phase (U phase), the at least one FET and the at least one SBD being the FET and the SBD in one of the semiconductor devices described above; at least one FET and at least one SBD corresponding to a second phase (V phase), the at least one FET and the at least one SBD being the FET and the SBD in one of the semiconductor devices described above; and at least one FET and at least one SBD corresponding to a third phase (W phase), the at least one FET and the at least one SBD being the FET and the SBD in one of the semiconductor devices described above, and a backside electrode of the first chip and an upper electrode of the second chip are connected to each other through a wiring line in each of the first phase (U phase) to the third phase (W phase). Thus, the three-phase AC-DC inverter having good withstand voltage characteristics and low on-resistance can be simplified and the entire structure of the device can be reduced in size.

A method for producing a semiconductor device of the present invention includes a step of preparing a GaN substrate; a step of forming an epitaxial layered body of first conductivity type GaN-based drift layer/second conductivity type GaN-based layer/first conductivity type GaN-based cap layer on the GaN substrate; a step of etching the epitaxial layered body on the GaN substrate in a first region to form a FET opening that reaches the first conductivity type GaN-based drift layer; a step of forming a channel-forming layer on an inside surface of the opening; and a step of etching the channel-forming layer and the epitaxial layered body in a second region by masking the first region with a resist film to form an SBD opening that reaches the first conductivity type GaN-based drift layer, wherein an electrode that is in Schottky contact with the first conductivity type GaN-based drift layer in the SBD opening is formed.

By the above-described method, a FET with a protection circuit can be formed on the GaN substrate. The on-resistance of a GaN-based semiconductor layer can be significantly reduced because a heterointerface can be easily formed by stacking GaN-based semiconductors having different band gaps (there are many GaN-based semiconductors that have different band gaps and are epitaxially grown) and the channel is easily formed using a HEMT structure. In addition, the GaN-based semiconductor has good withstand voltage characteristics. As a result, a switching element having good withstand voltage characteristics and on-resistance can be formed in a simple structure with a small size. Since this FET is a vertical element through which a current flows in the thickness direction of the epitaxial layered body, a large current can be passed.

Another method for producing a semiconductor device of the present invention includes a step of preparing a GaN substrate; a step of forming an epitaxial layered body of first conductivity type GaN-based drift layer/second conductivity type GaN-based layer/first conductivity type GaN-based cap layer on the GaN substrate; a step of etching the epitaxial layered body in a first region and a second region of the GaN substrate to form a FET opening in the first region, the FET opening reaching the first conductivity type GaN-based drift layer, and an SBD opening in the second region, the SBD opening reaching the first conductivity type GaN-based drift layer; a step of forming an insulating film so that the insulating film covers the FET opening, the SBD opening, and an unetched portion of the epitaxial layered body; and, in the FET opening, a step of forming a gate electrode so that the gate electrode and an inside surface of the second conductivity type GaN-based layer in the opening sandwich the insulating film, wherein an electrode that is in Schottky contact with the first conductivity type GaN-based drift layer is formed in the SBD opening by making a hole that penetrates through the insulating film.

Thus, a metal-insulator-semiconductor field effect transistor (MISFET) with a protection circuit can be formed on the common GaN substrate in a simple structure with a small size. Since this FET is a vertical element through which a current flows in the thickness direction of the epitaxial layered body, a large current can be passed. A GaN-based semiconductor layer has good withstand voltage characteristics and low on-resistance. Furthermore, in the above-described method, the FET and the SBD can be efficiently formed using the gate insulating film of a MIS as a mask.

Advantageous Effects of Invention

According to the present invention, there can be provided a semiconductor device that includes an SBD bypass protection unit against surge voltage or the like, achieves good withstand voltage characteristics and low on-resistance (low On-state voltage), has a simple structure, and is used for large-current purpose and a method for producing the semiconductor device.

BRIEF DESCRIPTION OF DRAWINGS

FIGS. 1(a) to 1(c) are a sectional view, a plan view, and a circuit diagram, respectively.

FIG. 3(a) is a plan view and FIG. 3(b) is a sectional view taken along line IIIB-IIIB.

FIG. 4(a) shows the state in which an epitaxial layered body has been formed, FIG. 4(b) shows the state in which a FET opening has been formed, FIG. 4(c) shows the state in which a channel-forming layer (HEMT structure) has been formed, FIG. 4(d) shows the state in which an SBD opening has been formed, and FIG. 4(e) shows the state in which a resist pattern has been formed before a source electrode is formed.

FIG. 10(a) shows the state in which a FET opening and an SBD opening have been formed and FIG. 10(b) shows the state in which a surface has been covered with a gate insulating film.

DESCRIPTION OF EMBODIMENTS (First Embodiment)

Figure 1:
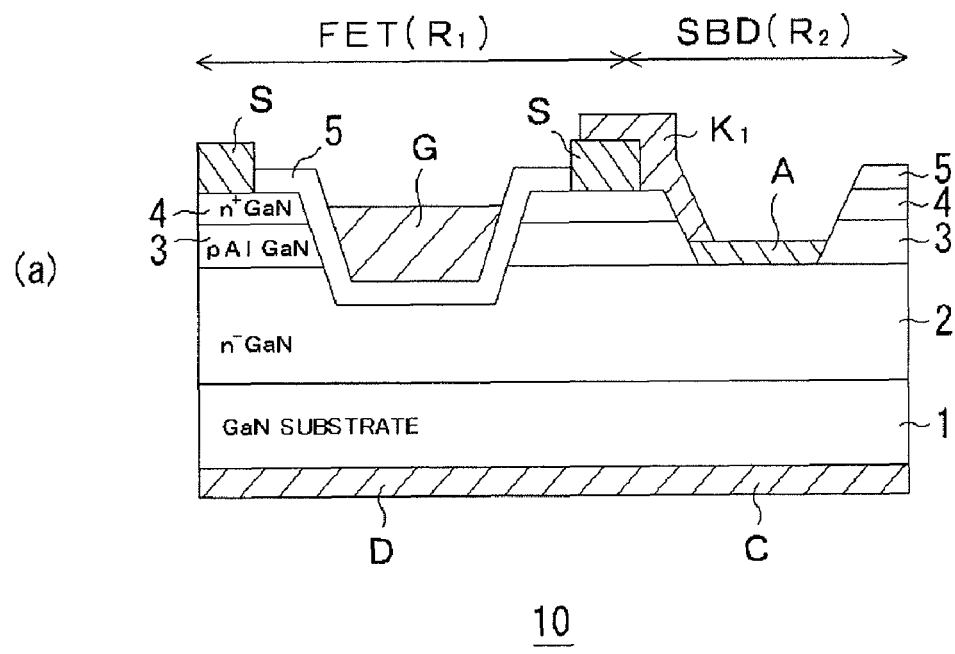
FIG. 1 shows a semiconductor device according to a first embodiment of the present invention.
Figure 1:
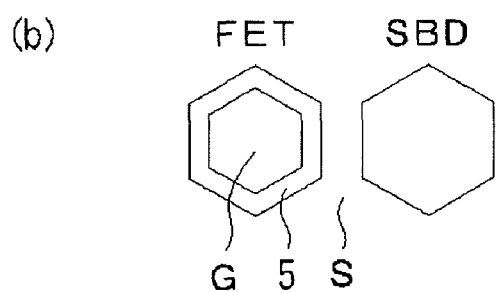
Figure 1:
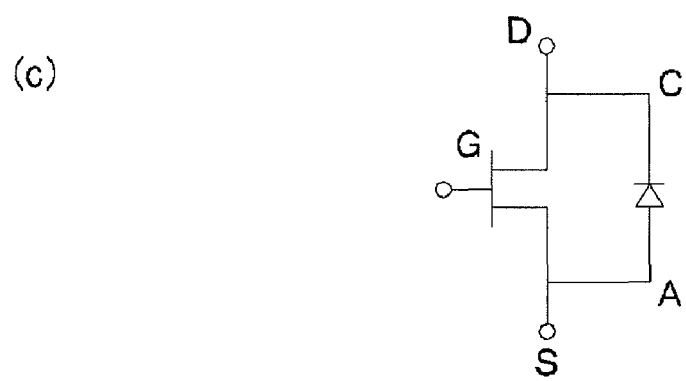

FIG. 1(a) is a diagram showing a semiconductor device 10 according to a first embodiment of the present invention. FIG. 1(b) is a plan view of the semiconductor device shown in FIG. 1(a). The semiconductor device 10 is formed of a substrate and a GaN layer that is formed on the substrate through ohmic contact, and includes a FET constituting a switching element and an SBD that serves as a protective element of the FET. The carrier density of an $n^+$-type GaN substrate 1 is, for example, about $3 \times 10^{18}$ cm$^{-3}$. The FET is formed in a first region R1 and the SBD is formed in a second region R2. An epitaxial layered body of $n^-$-type GaN drift layer 2/p-type AlGaN layer 3/$n^+$-type GaN cap layer 4 is formed on the $n^+$-type GaN substrate 1 in that order. The p-type AlGaN layer 3 increases the back potential of a channel to achieve the normally-off operation of the FET.

In the first region R1 where the FET is formed, an opening that reaches the $n^-$-type GaN drift layer 2 from the upper surface of the epitaxial layered body 2, 3, and 4 is formed, and a channel-forming layer 5 is formed on the inside surface of the opening. For the sake of convenience of the production process, the channel-forming layer 5 is formed up to the second region R2 where the SBD is formed, but this has no particular meaning. The channel-forming layer 5 of the FET is composed of a GaN-based semiconductor layer that is epitaxially grown on the inside surface of the opening and another GaN-based semiconductor layer having a band gap larger than that of the GaN-based semiconductor layer. In the channel-forming layer 5, a two-dimensional electron gas is generated by a signal voltage applied to a gate electrode G. A source electrode S of the FET is formed on the entire surface, but some portions (a gate region G of the FET and an anode region A of the SBD) of the source electrode A are removed by forming an opening.

In the On state, electrons that are carriers flow through the path of source electrode S→$n^+$-type GaN cap layer 4→channel-forming layer 5 (two-dimensional electron gas layer) →$n^-$-type GaN drift layer 2→$n^+$type GaN substrate 1→drain electrode D, which is a backside electrode. This electron-flowing path extends in the thickness direction of the epitaxial layered body or the like, which constitutes a vertical element.

An electrode of the SBD that achieves Schottky contact is an anode A, and electrons flow through the path of anode A→$n^-$-type GaN drift layer 2→$n^+$-type GaN substrate 1→cathode C, which is a backside electrode. This SBD has a feature in that the p-type AlGaN layer 3 of the FET extends from the first region R1 to the second region R2 and contacts the anode A so as to surround the anode A. The contact between the p-type AlGaN layer 3 and the anode A is preferably an ohmic contact to further improve withstand voltage characteristics, but is not necessarily an ohmic contact. The anode A of the SBD and the source electrode S of the FET are electrically connected to each other through a wiring layer K1. The cathode C, which is a backside electrode, and the drain D are formed in an integrated manner by forming a conductive layer at the same film formation timing. Obviously, they are electrically connected to each other.

FIG. 1(c) is a circuit diagram of the semiconductor device shown in FIG. 1. The FET constituting a switching element is connected to the SBD in parallel in terms of an electric circuit. For example, regardless of the presence or absence of an On-signal to the gate electrode of the FET, when a surge voltage or the like is applied to the source electrode S or the drain electrode, the SBD is brought into its On state to allow current to flow and functions as a bypass protection unit that prevents the application of a surge voltage to the FET for a certain period of time. In a Schottky electrode that is composed of Ni/Au and is in Schottky contact with GaN, a current can be caused to rise by applying a forward voltage of about 1 V. In contrast, such a voltage in the case of a GaN pn diode having a pn junction is about 3 V. Thus, a Schottky diode can bypass a surge current at an earlier timing of surge voltage rise than a pn diode.

Figure 2:
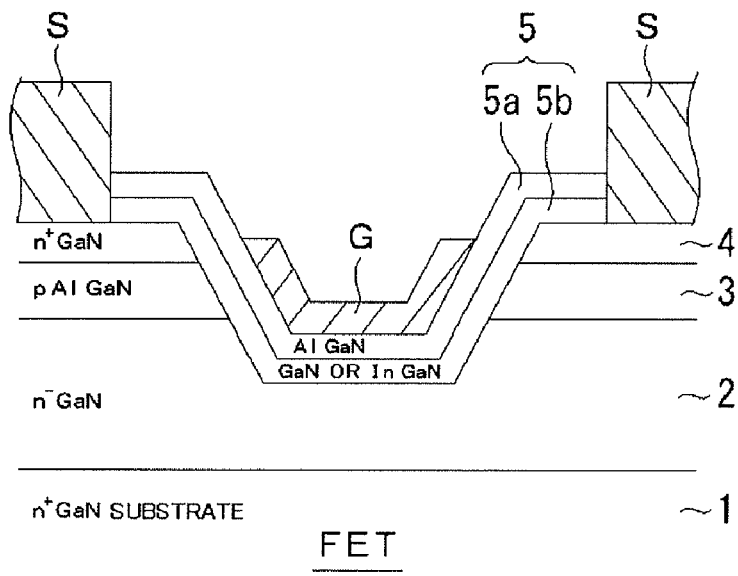
FIG. 2 is a diagram for describing a channel-forming layer of a FET of the semiconductor device shown in FIG. 1.
Figure 3:
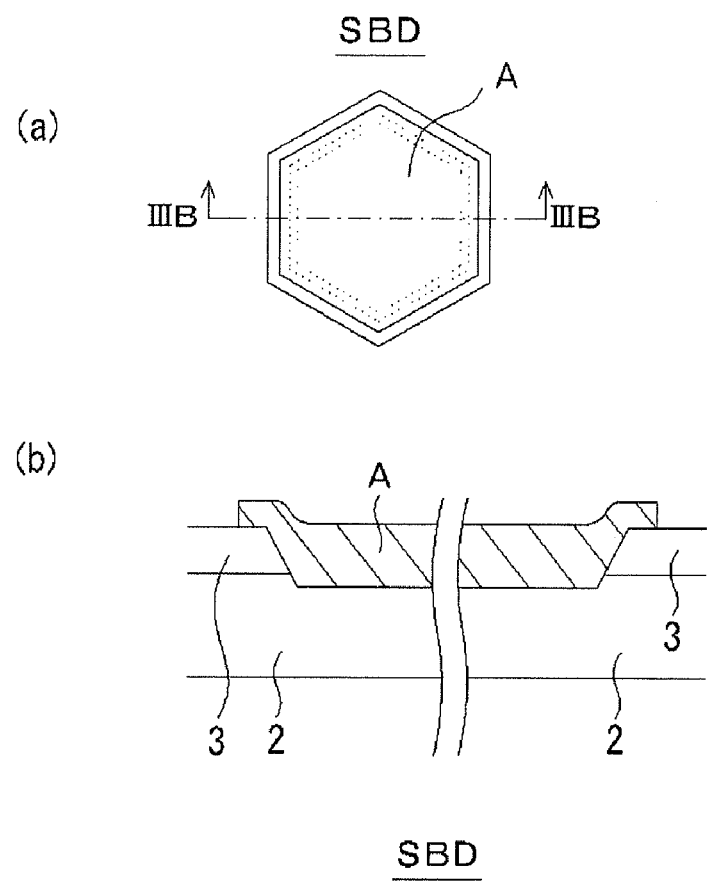
FIG. 3 is a diagram for describing an SBD of the semiconductor device shown in FIG. 1.

FIG. 2 is a diagram for describing the channel-forming layer 5 of the FET. The channel-forming layer 5 includes an electron conduction layer 5b formed of an undoped GaN layer or an undoped InGaN layer and an AlGaN layer 5a that supplies electrons and has a band gap larger than that of the electron conduction layer 5b. Although not shown in FIG. 2, an intermediate layer composed of an insulator such as AlN may be disposed between the electron conduction layer 5b and the electron supply layer 5a. The electron conduction layer 5b, the electron supply layer 5a, and the like are layers continuously formed through regrowth in the same growth chamber. By applying a signal voltage to the gate electrode G, a two-dimensional electron gas layer is formed at an interface between the electron conduction layer 5b and the electron supply layer 5a and thus the channel is brought into its On state. As long as the channel-forming layer 5 is not brought into its On state, electrons do not move from the $n^+$-type GaN cap layer 4 to the $n^-$-type GaN drift layer 2 because of the presence of the p-type AlGaN barrier layer 3, thereby achieving normally-off operation. As shown in FIGS. 3(a) and 3(b), the p-type AlGaN barrier layer 3 is in contact with the periphery of the Schottky electrode (anode electrode) A of the SBD and functions as a guard ring for the anode electrode A. The anode electrode A is formed so as to extend onto the p-type AlGaN barrier layer 3 in the periphery of the opening. With this guard ring, the withstand voltage characteristics of the anode electrode A of the SBD can be improved. The AlGaN layer 5a that supplies electrons may be doped with an n-type impurity. The doping with an n-type impurity can further decrease the on-resistance. Si may be doped as the n-type impurity in an amount of about $1 \times 10^{18}$ cm$^{-3}$.

In the semiconductor device shown in FIG. 1, the GaN substrate has an n conductivity type, and backside electrodes such as the drain electrode D of the FET or the cathode electrode C of the SBD can be directly formed on the back of the GaN substrate through ohmic contact in a shared manner. Furthermore, since a GaN-based drift layer or the like is directly formed on the GaN substrate 1, there is no need to use a buffer layer or the like. By simplifying the structure of the epitaxial layered body without using a buffer layer, the production process is simplified and thus the production time can be shortened and the production yield can be improved.

By combining the above-described advantage with the advantages of the mounting of the FET and the SBD onto the same GaN substrate, the direct formation of a backside electrode, and the formation of a backside electrode in a shared manner, the entire structure can be simplified and a reduction in size can be achieved. Since a GaN-based semiconductor layer formed on a GaN substrate is a vertical element and has good withstand voltage characteristics and low on-resistance, a large current can be passed. In this embodiment, the channel has a HEMT structure. Among wide gap semiconductors, GaN has many crystals that are epitaxially grown and have different band gaps compared with SiC or the like. Therefore, the channel-forming layer 5 such as a two-dimensional electron gas layer can be easily formed. In the FET shown in FIG. 1, this channel-forming layer 5 having a HEMT structure can provide significantly low on-resistance.

With the extending p-type AlGaN layer 3, a guard ring for the Schottky electrode A of the SBD can be formed, which can improve the withstand voltage characteristics of the SBD.

A method for producing the semiconductor device 10 shown in FIG. 1 will now be described. First, as shown in FIG. 4(a), an epitaxial layered body of $n^-$-type GaN drift layer 2/p-type AlGaN layer 3/$n^+$-type GaN cap layer 4 is formed on an $n^+$-type GaN substrate 1. The film formation is preferably performed by metal organic vapor phase epitaxy (MOVPE) at a growth temperature of about 1050° C., but may be performed by molecular beam epitaxy (MBE). The thickness and carrier density are exemplified below. The $n^-$-type GaN drift layer 2 has a thickness of 5 μm and a carrier density of $1.0 \times 10^{16}$ cm$^{-3}$, the p-type AlGaN layer 3 has a thickness of 0.5 μm and a carrier density of $5.0 \times 10^{16}$ cm$^{-3}$, and the $n^+$-type GaN cap layer 4 has a thickness of 0.3 μm and a carrier density of $5.0 \times 10^{17}$ cm$^{-3}$. In the case where the function of the p-type AlGaN layer 3 as a guard ring in the SBD is regarded as important, the carrier density may be increased to $1 \times 10^{17}$ cm$^{-3}$ to $1 \times 10^{19}$ cm$^{-3}$ from $5.0 \times 10^{16}$ cm$^{-3}$.

Next, as shown in FIG. 4(b), an opening H1 will be formed in a first region by etching. A resist pattern having an opening that corresponds to an opening H1 is formed. The opening H1 is then formed in the epitaxial layered body 2, 3, and 4 by reactive ion etching (RIE) using a chlorine-based gas. Consequently, since a crystal face is exposed at the inside surface (wall surface) of the opening H1, the epitaxial growth of a channel-forming layer 5 can be performed. The inside surface of the opening H1 has an inclination angle of about 20° relative to the surface of the GaN substrate. This inclination angle can be adjusted by changing the types of gases used in RIE or the flow ratio between gaseous components contained in a mixed gas.

Next, as shown in FIG. 4(c), the channel-forming layer 5 constituted by electron conduction layer 5b/electron supply layer 5a will be regrown. First, an i-type GaN layer of the electron conduction layer 5b is preferably formed by metal-organic chemical vapor deposition (MOCVD) at a growth temperature of about 1020° C. so as to have a thickness of about 50 nm. The AlGaN electron supply layer 5a is then preferably grown so as to have a thickness of about 30 nm. An AlN intermediate layer may be formed between the i-type GaN layer 5b and the AlGaN layer 5a at a growth temperature of about 1080° C. so as to have a thickness of about 2 nm.

To ensure a certain film formation rate, this regrown layer is preferably formed at a high V/III ratio and at a temperature lower than the growth temperature at which the epitaxial layered body has been formed. The above-described film formation may be performed by MBE instead of MOVPE.

Subsequently, as shown in FIG. 4(d), an opening H2 of the SBD is formed using a resist mask pattern in the same process as that of the opening H1 of the FET. A resist pattern having an opening at a position corresponding to a source electrode S is then formed as shown in FIG. 4(e), and a source electrode is formed of Ti/Al. Instead of Ti/Al, any alloy can be used as long as the alloy is brought into ohmic contact with the $n^+$-type GaN cap layer 4. After that, a wiring layer K1 on the upper surface is formed and backside electrodes D and C are formed of Ti/Al/Ti/Al. Herein, alloying heat treatment is preferably performed. A resist pattern having an opening at a position corresponding to a gate electrode G is then formed, and a gate electrode G composed of Ni/Au is formed on the electron supply layer 5a of the channel-forming layer 5. The gate electrode may be formed of Pt/Au, Pd/Au, Mo/Au, or the like, instead of Ni/Au.

A resist pattern having an opening at a position corresponding to an anode electrode A is then formed, and a Schottky electrode A is formed of Ni/Au. In some cases, the gate of the FET may be shared. Thus, the semiconductor device shown in FIG. 1 can be obtained.

(Second Embodiment)

Figure 5:
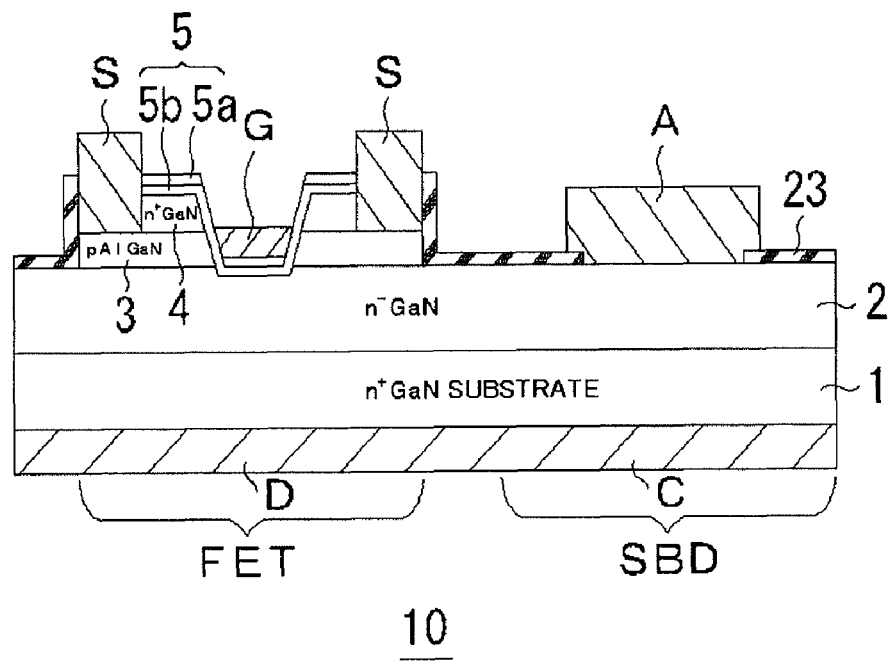
FIG. 5 is a diagram showing a semiconductor device according to a second embodiment of the present invention.

FIG. 5 is a diagram showing a semiconductor device 10 according to a second embodiment of the present invention. This embodiment is the same as the first embodiment in that a FET constituting a switching element and an SBD that serves as a protective element of the FET are disposed on an $n^+$-type GaN substrate 1. However, a p-type AlGaN layer 3 of the FET does not extend to the SBD and functions as a barrier layer of only the FET. Therefore, a layer that serves as a guard ring for the Schottky electrode A of the SBD is not formed, and a protective layer 23 covers the periphery of the Schottky electrode and the periphery of the source electrode S of the FET.

In the semiconductor device 10 shown in FIG. 5, the p-type AlGaN layer 3 of the FET does not extend to the region of the SBD. Thus, there are two production methods below. Both of the production methods can be performed using typical means.

(s1): A production method in which an epitaxial layered body of $n^-$-type GaN drift layer 2/p-type AlGaN layer 3/$n^+$-type GaN cap layer 4 is formed on an $n^+$-type GaN substrate 1 in that order, and then a portion of the SBD is removed by RIE until the $n^{--}$-type GaN drift layer 2 is exposed (s2): A production method in which an $n^-$-type GaN drift layer 2 is formed on the entire $n^+$-type GaN substrate 1, and then p-type AlGaN layer 3/$n^+$-type GaN cap layer 4 is selectively grown only in a portion of the FET.

In the production method (s2), an insulating mask pattern for selective growth is used. In the semiconductor device 10 shown in FIG. 5, the $n^-$-type GaN drift layer 2 is continuously formed in the regions of the FET and the SBD in a shared manner. However, the $n^-$-type GaN drift layer 2 may be separately formed in the regions of the FET and the SBD (refer to FIG. 8).

In the structure shown in FIG. 5, the same advantage can be achieved in terms of the function of the SBD that protects the FET, which is a switching element, from surge voltage or the like. That is, except that a guard ring for the Schottky electrode A of the SBD is not provided, other advantages are the same as those of the semiconductor device of the first embodiment. In other words, a vertical FET and a vertical SBD are arranged in parallel on the same GaN substrate 1, and the SBD functions as a protective element of the FET against surge voltage or the like. The GaN substrate 1 has an $n^+$ conductivity type, and backside electrodes such as the drain electrode D of the FET and the cathode electrode C of the SBD are directly formed on the back of the GaN substrate 1 through ohmic contact in a shared manner. Furthermore, since an n⁻-type GaN drift layer 2 is directly formed on the GaN substrate, there is no need to use a buffer layer or the like. By simplifying the structure of the epitaxial layered body without using a buffer layer, the production process is simplified and thus the production time can be shortened and the production yield can be improved. By combining the above-described advantage with the advantages of the mounting of the FET and the SBD onto the same GaN substrate 1 and the like, the entire structure can be simplified and a reduction in size can be achieved. Since the n⁻-type GaN layer 2, the p-type AlGaN layer 3, or the like formed on the GaN substrate 1 is a vertical element and has good withstand voltage characteristics and low on-resistance, a large current can be passed. Moreover, significantly low on-resistance can be achieved because of the two-dimensional electron gas layer formed in the channel-forming layer 5.

(Modification 1 of Second Embodiment)

Figure 6:
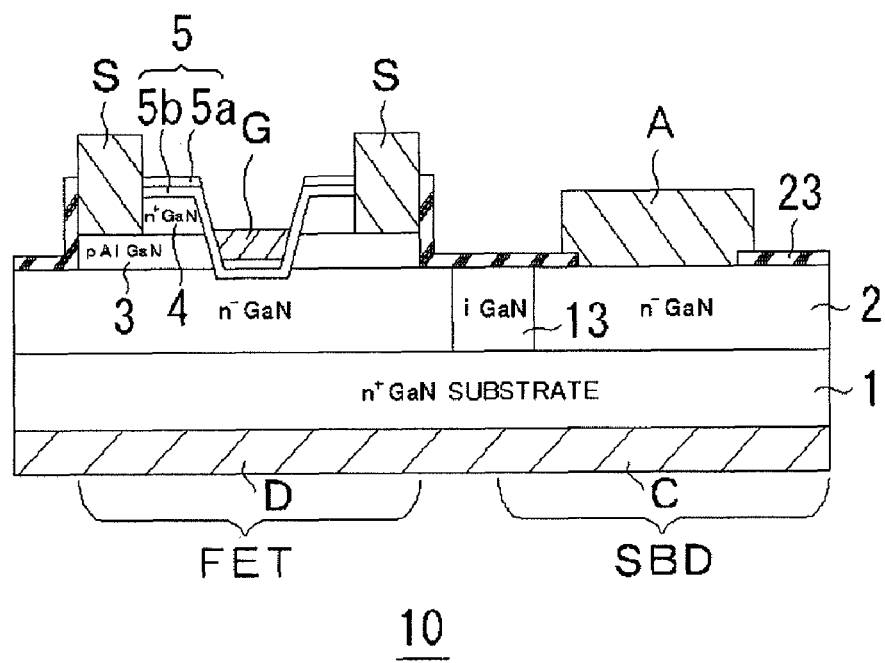
FIG. 6 is a diagram showing a semiconductor device according to a modification 1 of the second embodiment of the present invention.

FIG. 6 shows a modification 1 of the semiconductor device shown in FIG. 5, the modification 1 being one of the embodiments of the present invention. The semiconductor device 10 shown in FIG. 6 has the same basic structure as that of the semiconductor device shown in FIG. 5 and includes a FET that performs switching in accordance with the presence or absence of two-dimensional electron gas formation and an SBD that functions as a protective element of the FET. The difference between the semiconductor devices of FIGS. 5 and 6 is that, in the n--type GaN drift layer 2 shared by the FET and the SBD, an iGaN region 13 is formed at the boundary between the FET and the SBD. The iGaN region 13 separates a drift layer of the FET and a drift layer of the SBD. This separation can increase the resistance to a surge and suppress the occurrence of a breakdown.

Other advantages are the same as those of the semiconductor device of the second embodiment (FIG. 5). In other words, a vertical FET and a vertical SBD are arranged in parallel on the same GaN substrate 1, and the SBD functions as a protective element of the FET against surge voltage or the like. The GaN substrate 1 has an n⁺ conductivity type, and backside electrodes such as the drain electrode D of the FET and the cathode electrode C of the SBD are directly formed on the back of the GaN substrate 1 through ohmic contact in a shared manner. Furthermore, since an n⁻-type GaN drift layer 2 is directly formed on the GaN substrate, there is no need to use a buffer layer or the like. By simplifying the structure of the epitaxial layered body without using a buffer layer, the production process is simplified and thus the production time can be shortened and the production yield can be improved. By combining the above-described advantage with the advantages of the mounting of the FET and the SBD onto the same GaN substrate 1 and the like, the entire structure can be simplified and a reduction in size can be achieved. Since the n⁻GaN layer 2, the p-type AlGaN layer 3, or the like formed on the GaN substrate 1 is a vertical element and has good withstand voltage characteristics and low on-resistance, a large current can be passed. Moreover, significantly low on-resistance can be achieved because of the two-dimensional electron gas layer formed in the channel-forming layer 5.

(Modification 2 of Second Embodiment)

Figure 7:
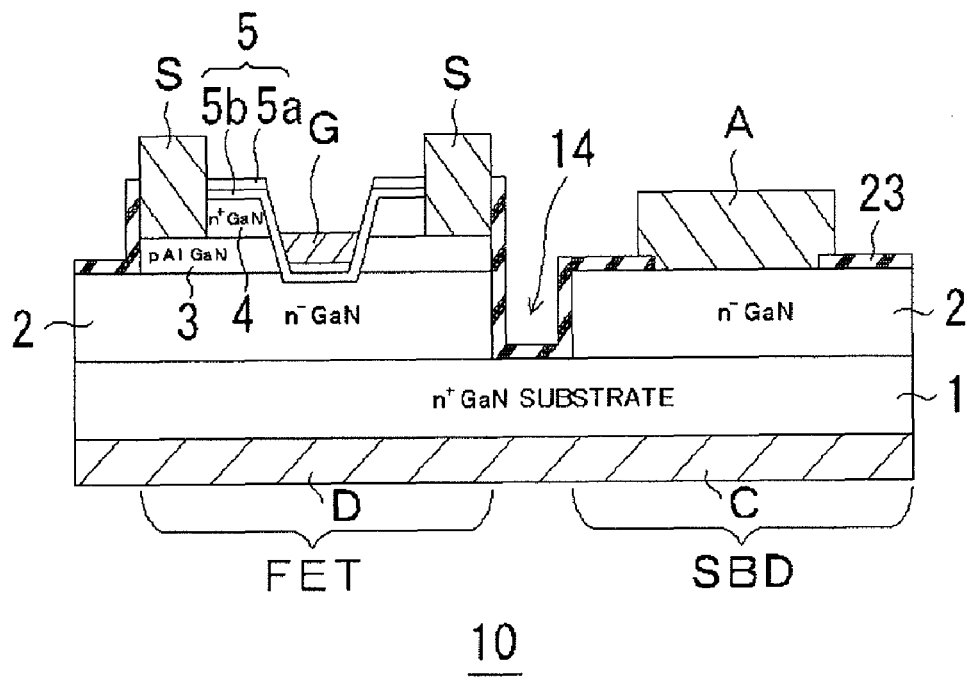
FIG. 7 is a diagram showing a semiconductor device according to a modification 2 of the second embodiment of the present invention.

FIG. 7 shows a modification 2 of the semiconductor device shown in FIG. 5, the modification 2 being one of the embodiments of the present invention. The semiconductor device 10 shown in FIG. 7 has the same basic structure as that of the semiconductor device shown in FIG. 5 and includes a FET that performs switching in accordance with the presence or absence of two-dimensional electron gas formation and an SBD that functions as a protective element of the FET. The difference between the semiconductor devices of FIGS. 5 and 7 is that, in the n--type GaN drift layer 2 shared by the FET and the SBD, a groove 14 is formed at the boundary between the FET and the SBD. The groove 14 separates a drift layer of the FET and a drift layer of the SBD.

Other advantages are the same as those of the semiconductor device of the modification 1 of the second embodiment (FIG. 6), whereby the description is omitted.

(Modification 3 of Second Embodiment)

Figure 8:
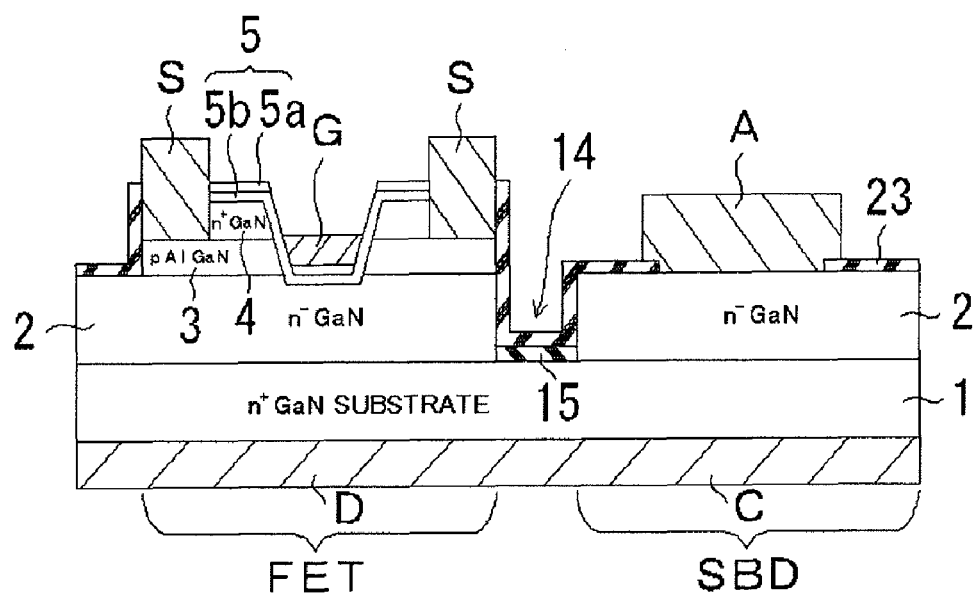
FIG. 8 is a diagram showing a semiconductor device according to a modification 3 of the second embodiment of the present invention.

FIG. 8 shows a modification 3 of the semiconductor device shown in FIG. 5, the modification 3 being one of the embodiments of the present invention. The modification 3 can be regarded as a modification of the modification 2 in that the groove 14 of the semiconductor device of the modification 2 shown in FIG. 7 is formed and an insulating mask 15 for selective growth is left at the bottom of the groove 14. The semiconductor device of the modification 3 (FIG. 8) can be produced by a method (s3) obtained by slightly modifying the method (s2).

The semiconductor device of the modification 3 has the same basic structure as that of the semiconductor device shown in FIG. 5 and includes a FET that performs switching in accordance with the presence or absence of two-dimensional electron gas formation and an SBD that functions as a protective element of the FET. The difference between the semiconductor devices of FIGS. 5 and 8 is that, in the n--type GaN drift layer 2 shared by the FET and the SBD, a groove 14 is formed at the boundary between the FET and the SBD and an insulating film 15 is formed at the bottom of the groove 14. The groove 14 and the insulating film 15 separate a drift layer of the FET and a drift layer of the SBD.

Other advantages are the same as those of the semiconductor device of the modification 1 of the second embodiment (FIG. 6), whereby the description is omitted.

(Third Embodiment)

Figure 9:
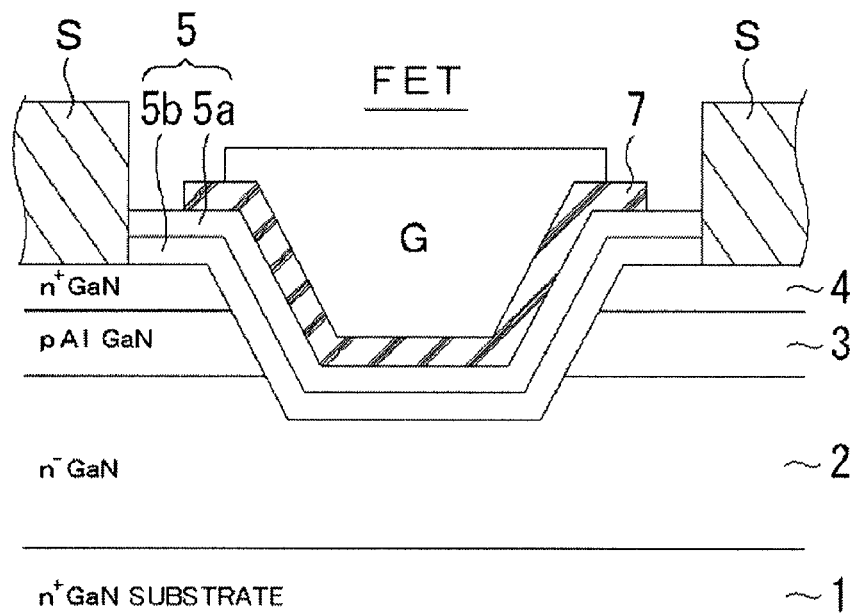
FIG. 9 is a diagram showing a channel portion of a FET in a semiconductor device according to a third embodiment of the present invention.

FIG. 9 is a diagram showing a channel portion of a FET in a semiconductor device according to a third embodiment of the present invention. The SBD has the same structure as that of the semiconductor device shown in FIG. 1. This embodiment has a feature in that the channel of the FET has a MOS structure. That is, a gate insulating film 7 is formed on the inside surface of the opening of epitaxial layered bodies of n⁻-type GaN drift layer 2/p-type AlGaN layer 3/n⁺-type GaN cap layer 4 and i-GaN electron conduction layer 5b/i-AlGaN electron supply layer 5a, and a gate electrode G is located on the gate insulating film 7. A source electrode S is formed so as to be in contact with the p⁻AlGaN layer, but may be in contact with the n⁺GaN layer. The channel is an inversion layer that is formed in the p-type AlGaN layer by applying a positive potential to the gate electrode G.

The semiconductor device of this embodiment is the same as that of the first embodiment, except that the structure of a channel in the FET is changed to a MIS structure from the HEMT structure constituted by the two-dimensional electron gas layer in the first embodiment. A vertical FET and a vertical SBD are arranged in parallel on the same GaN substrate 1, and the SBD functions as a protective element of the FET against surge voltage or the like. Backside electrodes such as the drain electrode D of the FET and the cathode electrode C of the SBD are directly formed on the back of the GaN substrate 1 through ohmic contact in a shared manner. Since an n⁻-type GaN drift layer 2 is directly formed on the GaN substrate, there is no need to use a buffer layer or the like. Therefore, the production process is simplified and thus the production time can be shortened and the production yield can be improved. By combining the above-described advantage with the advantage of the mounting of the FET and the SBD onto the same GaN substrate 1, the entire structure can be simplified and a reduction in size can be achieved. Since the n-GaN layer 2, the p-type AlGaN layer 3, or the like formed on the GaN substrate 1 is a vertical element and has good withstand voltage characteristics and low on-resistance, a large current can be passed.

Figure 4:
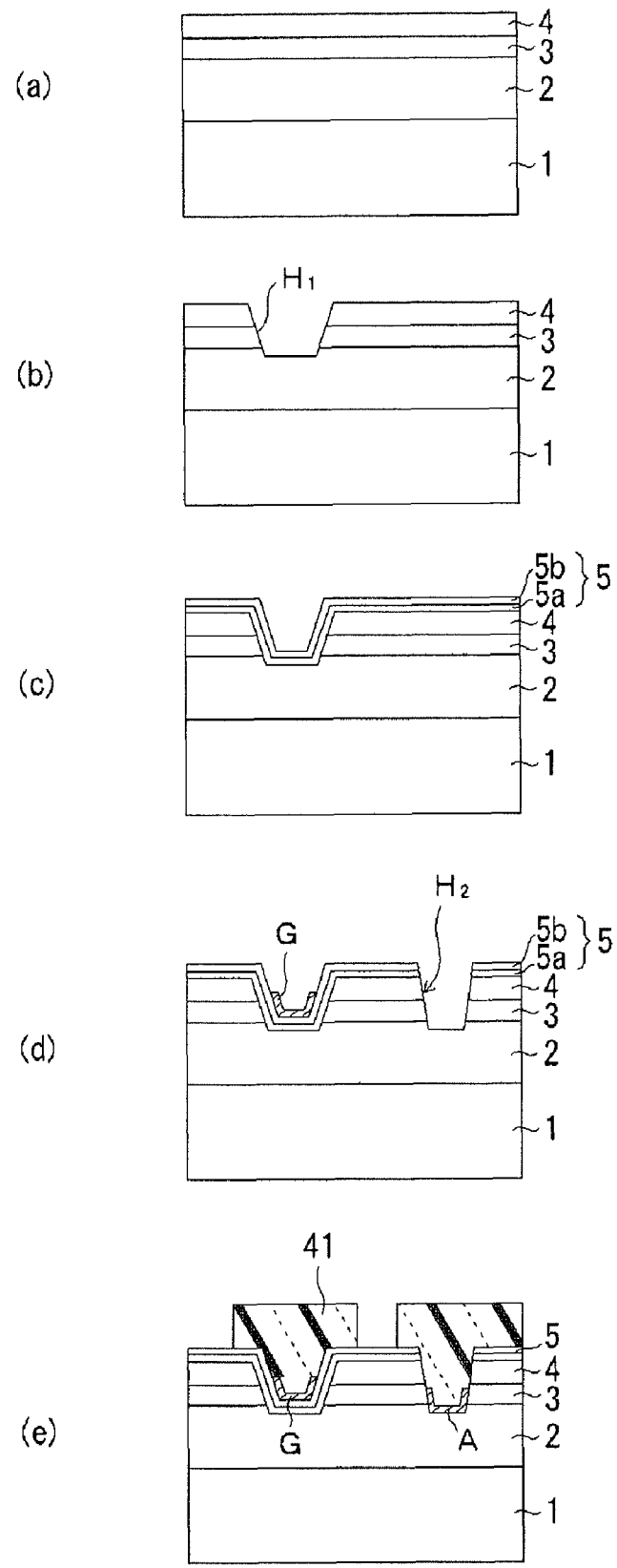
FIG. 4 is a diagram for describing a production process of the semiconductor device shown in FIG. 1.
Figure 10:
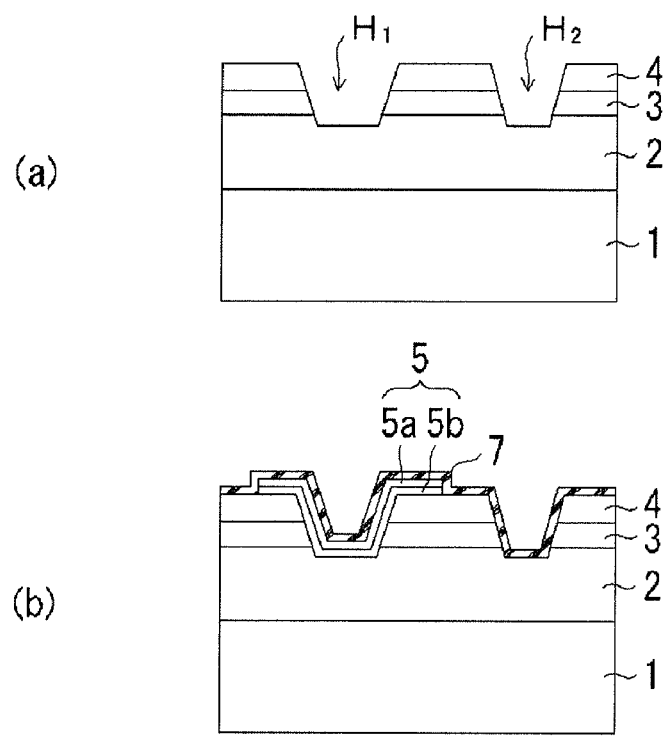
FIG. 10 shows a method for producing the semiconductor device according to the third embodiment of the present invention.

The production method in the case where a channel portion having a MIS structure is formed is different from that shown in FIG. 4 in the following point. That is, an epitaxial layered body of n⁻-type GaN drift layer 2/p-type AlGaN layer 3/n⁺-type GaN cap layer 4 is formed on an n⁺-type GaN substrate 1 in that order. As shown in FIG. 10(a), a FET opening H1 and an SBD opening H2 are then formed at positions corresponding to the FET and the SBD, respectively. Subsequently, as shown in FIG. 10(b), regrown layers are formed in the FET opening H1 in the order of an i-GaN electron conduction layer 5b and an i-AlGaN electron supply layer 5a. The entire surface is then covered with a gate insulating film 7. After that, a FET is formed by a typical method and then an SBD is formed.

(Fourth Embodiment)

Figure 11:
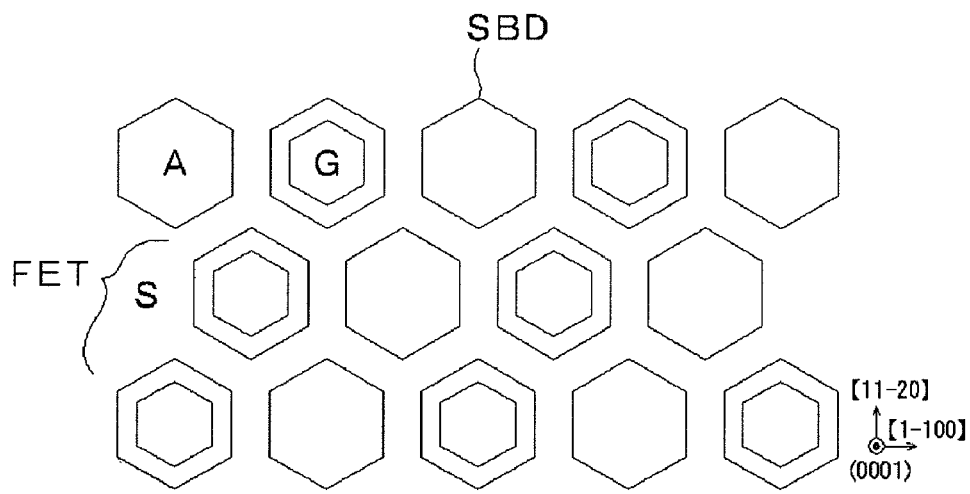
FIG. 11 is a plan view of a semiconductor device according to a fourth embodiment of the present invention.

FIG. 11 is a plan view of a semiconductor device according to a fourth embodiment of the present invention. In this embodiment, two or more FETs and one or more SBDs are arranged on a GaN substrate. The SBDs are each located in at least one of positions adjacent to a FET. The FETs are connected to a corresponding SBD or corresponding SBDs in parallel in an individual or grouped manner. Herein, the FETs in the same group are connected to each other in parallel. Thus, the SBDs connected in parallel to the FETs in the same group are all connected to each other in parallel. However, all of the FETs/SBDs formed on the same GaN substrate are not necessarily connected to each other in parallel.

Figure 12:
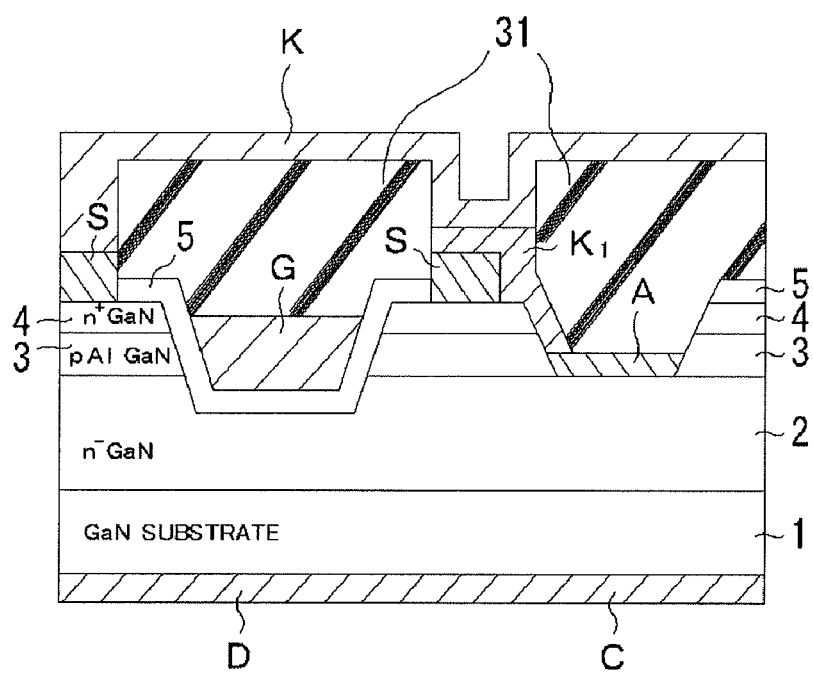
FIG. 12 is a sectional view showing the wiring in the semiconductor device shown in FIG. 11.

FIG. 12 is a diagram showing an electric wiring configuration for one FET and one SBD that are adjacent to each other and are connected to each other in parallel (belong to the same group). In the FET and the SBD that belong to the same group, after the gate electrode G in the FET is coated with an interlayer insulating film 31, the source electrode S and the anode electrode (Schottky electrode) A are electrically connected to each other through a wiring line K1 and a common wiring line K. Similarly, in the same group, the drain electrode D of the FET and the cathode C of the SBD, which are backside electrodes, are also electrically connected to each other in a shared manner. By employing such a wiring line configuration, a wiring line that has a simple structure, operates a plurality of FETs, and has a high current-carrying capacity can be produced in a simple production process. In this wiring structure, a signal line (not shown) and the gate electrode G to which the signal line is connected are protected from a large current with certainty. Therefore, the On/Off operation of a large current can be performed with certainty using signal line/gate electrode G while high stability is maintained.

As shown in FIG. 12, the FET has the same structure as that in the semiconductor device shown in FIG. 1. The SBD also has the same structure as that in the semiconductor device shown in FIG. 1. Regarding the plurality of FETs in the same group, a plurality of FETs may be considered to be arranged in parallel instead of one FET of the semiconductor device shown in FIG. 1. As shown in FIG. 12, the source electrode S and the like are electrically connected to each other through the common wiring line K while the gate electrode G is coated with the interlayer insulating film 31. In the parallel arrangement in this case, the FET and the SBD are not necessarily arranged so as to be spatially adjacent to each other and may be connected to each other in parallel through the common wiring line K. The same applies to the SBD arranged in parallel with a single FET or a plurality of FETs in the same group.

The GaN substrate that has been described so far is a c face ({0001} face) substrate. In FIG. 11, the outlines of the FETs and the SBDs are expressed in a hexagonal shape using an m face ({1-100} face), but the outlines thereof in an actual semiconductor device may be a quadrilateral shape instead of the hexagonal shape. By employing a hexagonal shape or a quadrilateral shape, the FETs and the SBDs can be densely arranged in a plane without a gap.

In the semiconductor device of this embodiment, since the FETs and the SBDs are located so as to be adjacent to each other, heat generated at the FETs and the SBDs is easily conducted to the adjacent region. Therefore, the temperature is not locally increased, whereby the thermal resistance can be improved.

On the same GaN substrate 1, the SBDs function as protective elements of the FETs against surge voltage or the like. The GaN substrate 1 has an n⁺ conductivity type, and backside electrodes such as the drain electrode D of the FET and the cathode electrode C of the SBD are directly formed on the back of the GaN substrate 1 through ohmic contact. Since an n⁻-type GaN drift layer 2 is directly formed on the GaN substrate, there is no need to use a buffer layer or the like. Therefore, the production process is simplified and thus the production time can be shortened and the production yield can be improved. The n⁻ GaN layer 2, the p-type AlGaN layer 3, or the like formed on the GaN substrate 1 has good withstand voltage characteristics and low on-resistance. By using a plurality of vertical elements, a large current can be passed with a small size device. Moreover, significantly low on-resistance can be achieved because of the two-dimensional electron gas layer formed in the channel-forming layer 5.

Since the Schottky electrode A of the SBD is surrounded by the p-type AlGaN layer 3 and is in contact with the p-type AlGaN layer 3, the withstand voltage characteristics can be improved due to the guard ring effect caused by the p-type AlGaN layer 3.

(Fifth Embodiment)

Figure 13:
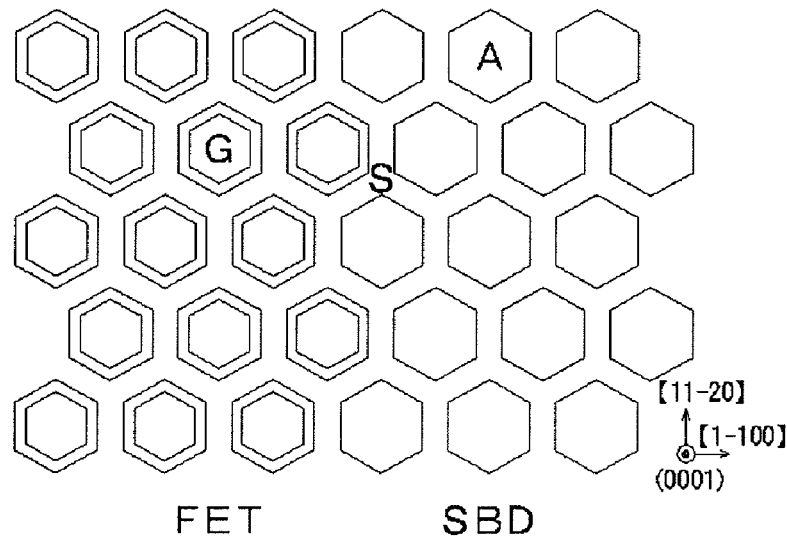
FIG. 13 is a plan view of a semiconductor device according to a fifth embodiment of the present invention.

FIG. 13 is a plan view of a semiconductor device according to a fifth embodiment of the present invention. In this embodiment, a FET region including two or more FETs grouped together and an SBD region including two or more SBDs grouped together are arranged on a GaN substrate, the FET region and the SBD region having a boundary therebetween. The FETs are connected to a corresponding SBD or corresponding SBDs in parallel in an individual or grouped manner. The anode A of the SBD and the source of the FET are formed in a continuous manner unless otherwise specified.

Consequently, a simple wiring configuration can be achieved while dealing with a large current. For example, in a device including a plurality of FETs in order to treat a large current, by arranging the group including a plurality of FETs and one or a plurality of SBDs in a direction perpendicular to the direction of the boundary (the upper electrodes (anode electrode and source electrode) of the SBD and the FET disposed with the boundary therebetween are electrically connected to each other), the current path for the large current can be easily made by film formation and thus the production process can be simplified.

Other advantages are the same as those in the fourth embodiment.

(Sixth Embodiment)

Figure 14:
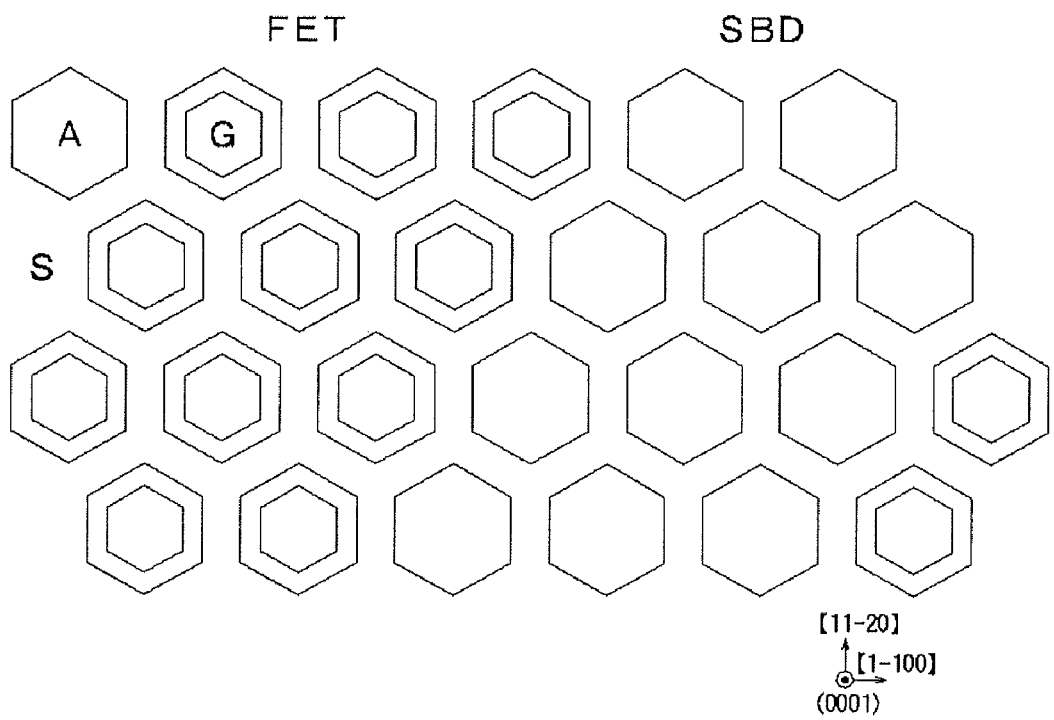
FIG. 14 is a plan view of a semiconductor device according to a sixth embodiment of the present invention.

FIG. 14 is a plan view of a semiconductor device according to a sixth embodiment of the present invention. In this embodiment, two or more FET regions including two or more FETs grouped together and one or more SBD regions including two or more SBDs grouped together are arranged on a GaN substrate so that one out of the two or more FET regions and the one or more SBD regions is interposed between the others. The FETs are connected to a corresponding SBD or corresponding SBDs in parallel in an individual or grouped manner.

According to the structure shown in FIG. 14, since the grouping of the FETs and SBDs is easily performed, a plurality of the same groups to be connected to each other in parallel can be easily selected. Furthermore, in the same group, the sorting into the in-phase subgroup in which On/Off operation is conducted in phase can be easily performed. Therefore, the sorting of a current path and a signal line for a large current that requires On/Off operation performed on a plurality of FETs in phase can be achieved with a simple structure.

In the semiconductor device of this embodiment, since the FET regions and the SBD regions are located so as to be adjacent to each other, heat generated at the FET regions and the SBD regions is easily conducted to the adjacent region. Therefore, despite the fact that a large current can be passed with a simple structure, the temperature is not locally increased, whereby the thermal resistance can be improved.

Other advantages are the same as those in the fourth embodiment.

(Modification 1 of Sixth Embodiment)

Figure 15:
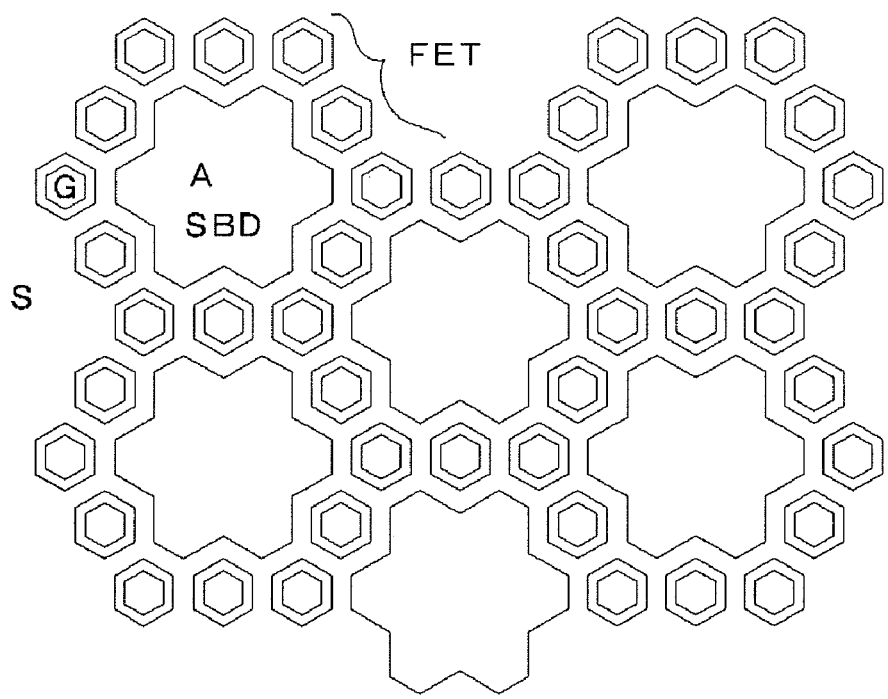
FIG. 15 is a plan view of a semiconductor device according to a modification 1 of the sixth embodiment of the present invention.

FIG. 15 shows a modification 1 of a sixth embodiment, which is one of the embodiments of the present invention. The semiconductor device shown in FIG. 15 can be regarded as a modification of the sixth embodiment or a modification of the fourth embodiment. In this semiconductor device, FETs are arranged around one SBD. The SBD and the FETs are different from each other in size, and the size of the SBD is larger than that of the FETs.

According to the above-described structure, elements can be arranged at the highest density, which is suitable to reduce the area of a chip. Furthermore, since the FETs and the SBDs are present in a mixed manner, heat generated from On-state elements is easily diffused to Off-state elements. Thus, a sudden temperature increase can be suppressed.

(Modification 2 of Sixth Embodiment)

Figure 16:
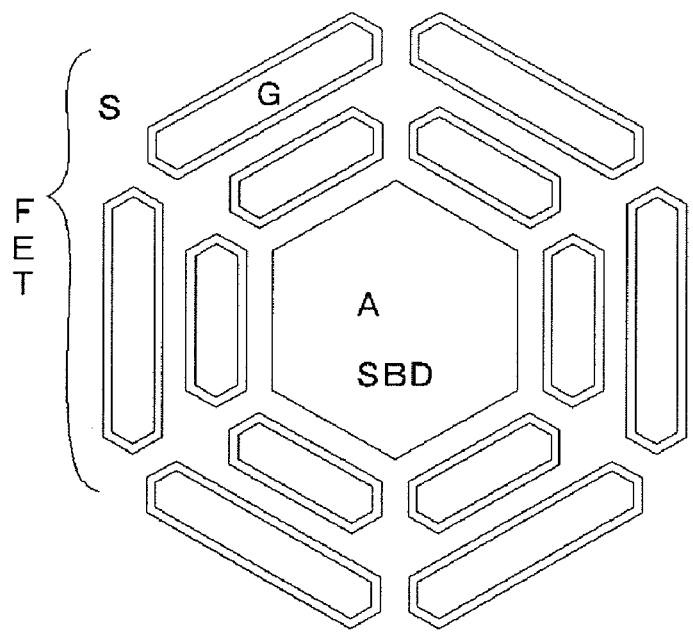
FIG. 16 is a plan view of a semiconductor device according to a modification 2 of the sixth embodiment of the present invention.

FIG. 16 shows a modification 2 of the sixth embodiment, which is one of the embodiments of the present invention. The semiconductor device shown in FIG. 16 can also be regarded as a modification of the sixth embodiment or a modification of the fourth embodiment. In this semiconductor device, FETs are arranged around one large SBD in a radial manner at angles of 60 degrees.

In the above-described structure, the size of a chip is increased compared with the modification 1 shown in FIG. 15. However, since the number of straight portions is increased (there is almost no structure in which short straight portions are continuously formed through bending portions), the production is easily performed and the yield can be improved.

(Modification 3 of Sixth Embodiment)

Figure 17:
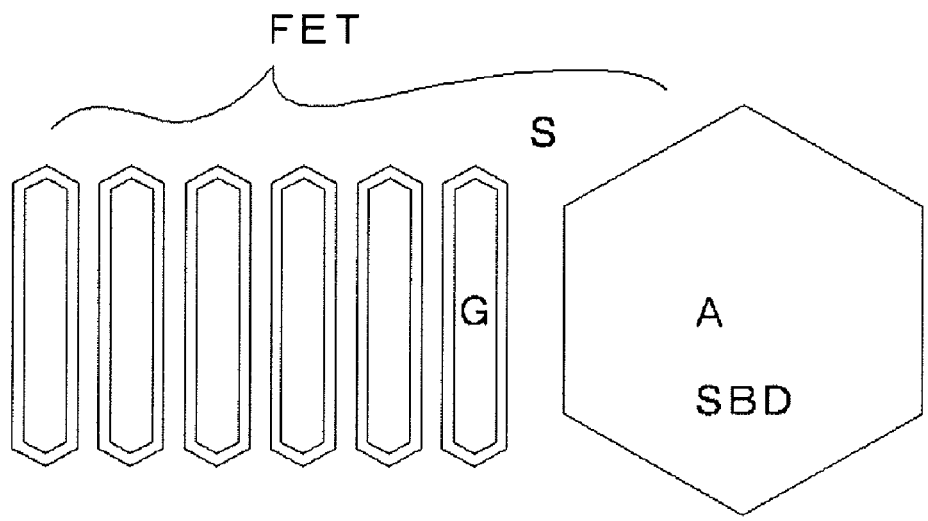
FIG. 17 is a plan view of a semiconductor device according to a modification 3 of the sixth embodiment of the present invention.

FIG. 17 shows a modification 3 of the sixth embodiment, which is one of the embodiments of the present invention. The semiconductor device shown in FIG. 17 can be regarded as a modification of the sixth embodiment or a modification of the fourth or fifth embodiment. In this semiconductor device, the gate electrodes G of the FET are arranged in a row so as to form a finger-like shape and face in the same direction, and a large SBD is disposed beside the gate electrodes G.

In the above-described structure, the wiring is easily formed and thus the yield can be improved.

(Modification 4 of Sixth Embodiment)

Figure 18:
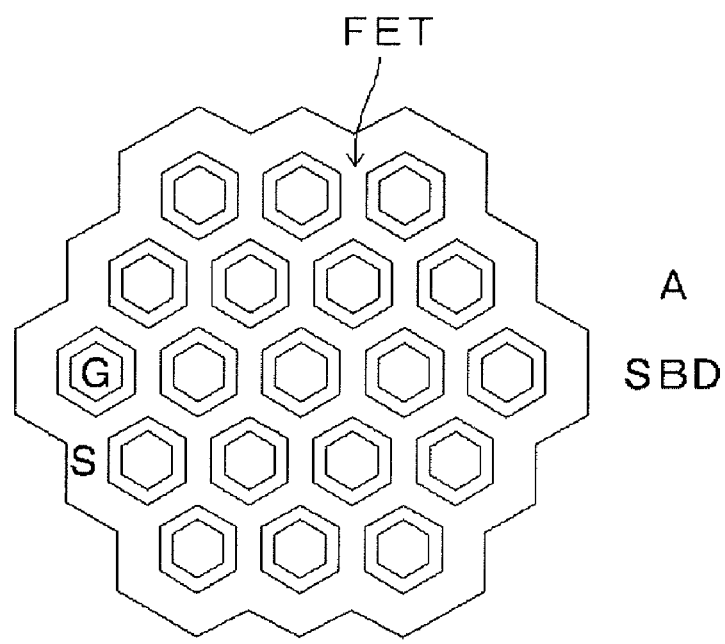
FIG. 18 is a plan view of a semiconductor device according to a modification 4 of the sixth embodiment of the present invention.

FIG. 18 shows a modification 4 of the sixth embodiment, which is one of the embodiments of the present invention. The semiconductor device shown in FIG. 18 can be regarded as a modification of the sixth embodiment or a modification of the fourth or fifth embodiment. In this semiconductor device, minute FETs are integrated and an SBD is disposed around the FETs.

In this structure, the FETs are arranged at a high density and thus the area of a chip can be reduced. Furthermore, since the FETs and the SBDs are separated from each other, the wiring is easily formed and thus the yielding can be improved.

(Seventh Embodiment)

Figure 19:
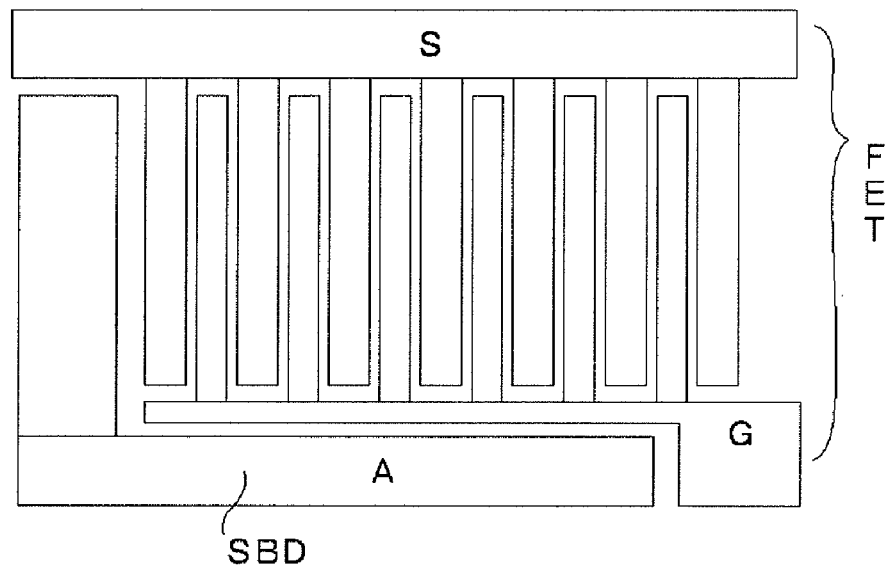
FIG. 19 is a plan view of a semiconductor device according to a seventh embodiment of the present invention.

FIG. 19 is a plan view of a semiconductor device 10 according to a seventh embodiment of the present invention. This semiconductor device is the same as those of the first to sixth embodiments in that the semiconductor device includes an epitaxial layered body of $n^-$-type GaN drift layer/p-type AlGaN layer/$n^+$-type GaN cap layer 4 formed on the $n^+$-type GaN substrate and a FET and an SBD are formed thereon. However, the structures of the electrodes of the FET and the SBD are different. The p-type AlGaN layer of the FET extends so as to serve as a guard ring of a Schottky electrode of the SBD.

In the semiconductor device shown in FIG. 19, the openings of the FET and the SBD are formed in a ridge shape. That is, a groove is formed in the epitaxial layered body of $n^-$-type GaN drift layer/p-type AlGaN layer/$n^+$-type GaN cap layer 4 so as to reach the $n^-$-type GaN drift layer. A channel of the FET is formed on the inside surface of the ridge-shaped or groove-shaped opening so as to be along the groove. In the SBD, an anode electrode A that is in Schottky contact with the $n^-$-type GaN drift layer extending at the bottom of the groove is formed so as to be in parallel with the FET.

In the FET, the base portion of a gate electrode G and the base portion of a source electrode S face each other, and a single gate electrode G and two source electrodes S that sandwich the single gate electrode G extend in a comb-shaped manner. The comb-shaped electrodes extend in the direction of the ridge or the groove. The anode electrode A of the SBD extends from the base portion of the source electrode S in parallel with the source electrode S. A drain electrode, which is a backside electrode of the FET, and a cathode electrode of the SBD can be separated from each other by forming a groove or a slit in accordance with the output level.

The cross section of these comb-shaped electrodes has a structure in which the semiconductor devices shown in FIG. 1 are repeatedly arranged. The channel in the FET may have a HEMT structure of iGaN/AlGaN or a MIS structure.

By densely arranging gate electrodes and upper electrodes of the FET, a large current can be passed in the thickness direction while high current density is maintained. Furthermore, since the p-type AlGaN layer of the FET extends so as to be in contact with a Schottky electrode of the SBD, a guard ring effect can be produced.

(Modification of Seventh Embodiment)

Figure 20:
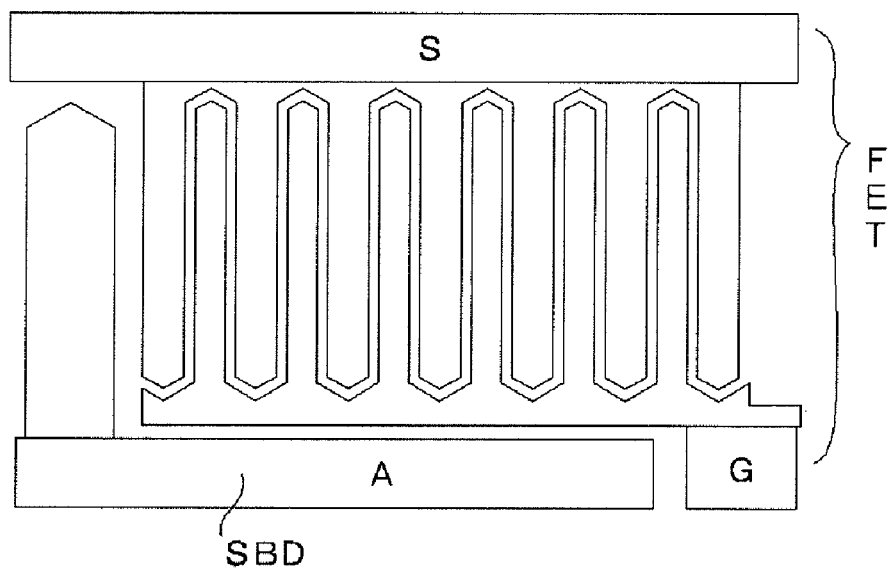
FIG. 20 is a plan view of a semiconductor device according to a modification of the seventh embodiment of the present invention.

FIG. 20 shows a modification of the seventh embodiment, which is one of the embodiments of the present invention. In this semiconductor device, the edge of a finger of a gate electrode is rounded compared with the FET of the semiconductor device shown in FIG. 19. In this structure, the surface area of a source electrode S can be increased, whereby a larger current can be passed.

(Eighth Embodiment)

FIG. 21(a) is a diagram showing a semiconductor device 10 according to an eighth embodiment of the present invention. FIG. 21(b) is an electric circuit diagram. The semiconductor device according to this embodiment constitutes an inverter that performs power conversion between direct current and three-phase current. An inverter 10 includes a first chip a and a second chip b. The first chip a and the second chip b include FETs and SBDs on respective n+-type GaN substrates 1a and 1b, and a U phase, a V phase, and a W phase each include one of the FETs and one of the SBDs. The one FET and the one SBD in each of the phases correspond to those in the semiconductor device 10 shown in FIG. 1. As shown in the circuit diagram of FIG. 21(b), FETs/SBDs that cover a potential higher than or equal to the output potential and correspond to the U phase, V phase, and W phase are arranged on the first chip a and FETs/SBDs that cover a potential lower than or equal to the output potential and correspond to the U phase, V phase, and W phase are arranged on the second chip b. As shown in FIG. 21(b), in each of the phases, the source electrode S of the FET having a potential lower than or equal to the output potential is electrically connected to the drain electrode D of the FET in the same phase having a potential higher than or equal to the output potential. That is, in each of the phases, the backside electrode of the first chip a is electrically connected to the upper electrode of the second chip b as shown in FIG. 21(a).

Figure 21:
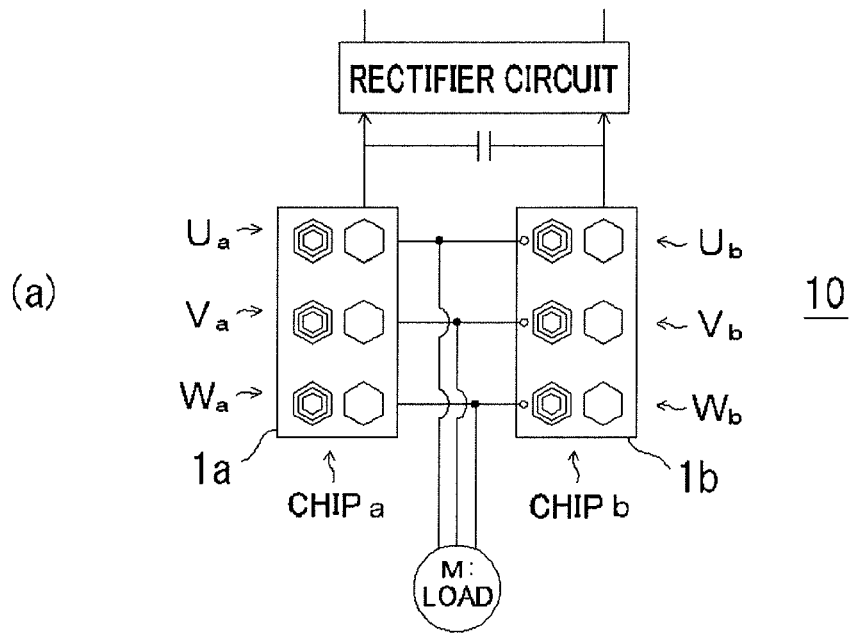
FIG. 21(a) is a plan view of a three-phase AC-DC inverter that is a semiconductor device according to an eighth embodiment of the present invention.
FIG. 21(b) is a circuit diagram.
Figure 21:
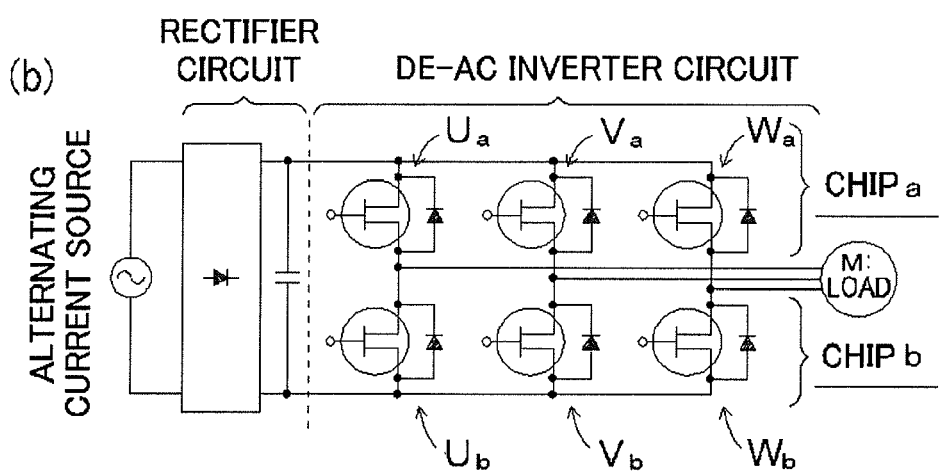

According to the three-phase AC-DC inverter shown in FIG. 21, the on-resistance is low and thus a large current can be passed. Furthermore, a small size device can be obtained due to its simple structure. As a result, there can be provided a three-phase AC-DC inverter that is produced at low cost and high production yield and has low power consumption, a small size, and high quality.

The embodiments of the present invention have been described above, but the embodiments of the present invention disclosed above are mere examples and the scope of the present invention is not limited to these embodiments. The scope of the present invention is defined by the appended claims, and all changes that fall within the scope of the claims and the equivalence thereof are therefore embraced by the claims.

Industrial Applicability

According to the present invention, there can be provided an inverter or the like that has low on-resistance, good withstand voltage characteristics, and a small size due to its simple structure and allows a large current to be passed. As a result, there can be provided a semiconductor device, such as a three-phase AC-DC inverter, that is produced at low cost and high production yield and has low power consumption, a small size, and high quality.

Reference Signs List 1 n+-type GaN substrate
1a, 1b n+-type GaN substrate of chip
2 n−-type GaN drift layer
3 p-type AlGaN layer
4 n+-type GaN cap layer
5 channel-forming layer (HEMT structure)
5a electron supply layer
5b electron conduction layer
7 gate insulating film
10 semiconductor device
13 iGaN region
14 groove
15 insulating layer
23 protective insulating layer
31 interlayer insulating film
41 resist pattern
a, b chip
A anode
C cathode
D drain electrode
G gate electrode
H1 FET opening
H2 SBD opening
K common wiring line
K1 wiring line
R1 first region (FET)
R2 second region (SBD)
S source electrode

The invention claimed is:

1. A semiconductor device comprising:
a field effect transistor (FET) including a first conductivity type drift layer and constituting a switching element in a first region of a substrate having a GaN layer that is in ohmic contact with a supporting substrate; and
a Schottky barrier diode (SBD) having an electrode that is in Schottky contact with a first conductivity type layer located in a second region of the substrate,
wherein the FET and the SBD are arranged in parallel,
a backside electrode of the FET and a backside electrode of the SBD are formed on a back of the substrate,
comprising a second conductivity type layer and a first conductivity type cap layer formed on the first conductivity type drift layer in the first region and each having an opening formed therein, wherein a cylindrical channel-forming portion of the FET is located so as to contact an inside surface of the opening, a gate electrode is located so that the gate electrode and an inside surface of the second conductivity type layer in the opening sandwich the channel-forming portion, and the second conductivity type layer extends from the first region to the second region and directly contacts a Schottky electrode of the SBD, and
wherein the cylindrical channel-forming portion is a regrown layer that includes a first GaN-based semiconductor layer through which carriers transit and a second GaN-based semiconductor layer having a band gap larger than that of the first GaN-based semiconductor layer.

2. The semiconductor device according to claim 1, wherein the openings extend in a ridge shape and are formed on the first conductivity type drift layer in the FET, wherein the cylindrical channel-forming portion of the FET extends while contacting the inside surface of the opening that extends in the ridge shape, the gate electrode extends so that the gate electrode and the inside surface of the second conductivity type layer in the ridge-shaped opening sandwich the channel-forming portion, two source electrodes extend so as to sandwich the extending gate electrode when viewed in plan, the Schottky electrode of the SBD extends in a direction in which the two source electrodes extend, and the second conductivity type layer contacts the Schottky electrode of the SBD.

* * * * *

UNITED STATES PATENT AND TRADEMARK OFFICE
CERTIFICATE OF CORRECTION

| | |
|---|---|
| PATENT NO. | : 8,227,810 B2 |
| APPLICATION NO. | : 13/126569 |
| DATED | : July 24, 2012 |
| INVENTOR(S) | : Okada et al. |

Page 1 of 1

It is certified that error appears in the above-identified patent and that said Letters Patent is hereby corrected as shown below:

On the Title Page:

At item (73) Assignee, in the second Assignee's name, replace the word

"Devices" with --Device--.

Signed and Sealed this
Twenty-seventh Day of November, 2012

David J. Kappos
*Director of the United States Patent and Trademark Office*